United States Patent [19]
Grover et al.

[11] Patent Number: 5,968,263
[45] Date of Patent: Oct. 19, 1999

[54] OPEN-LOOP METHOD AND SYSTEM FOR CONTROLLING GROWTH OF SEMICONDUCTOR CRYSTAL

[75] Inventors: Sunil Grover, Chicago, Ill.; Steven L. Kimbel, St. Charles, Mo.

[73] Assignee: MEMC Electronic Materials, Inc., St. Peters, Mo.

[21] Appl. No.: 09/053,164

[22] Filed: Apr. 1, 1998

[51] Int. Cl.[6] ................................... C30B 15/20
[52] U.S. Cl. ............................... 117/14; 117/15; 117/16; 117/30
[58] Field of Search ................................ 117/13, 14, 15, 117/16, 30

[56] References Cited

U.S. PATENT DOCUMENTS

| | | | |
|---|---|---|---|
| 3,934,983 | 1/1976 | Bardsley et al. | 117/202 |
| 4,710,258 | 12/1987 | Latka | 156/601 |
| 4,822,449 | 4/1989 | Motakef | 156/601 |
| 4,857,278 | 8/1989 | Gevelber et al. | 117/202 |
| 4,876,438 | 10/1989 | Watanabe et al. | 219/497 |
| 4,971,652 | 11/1990 | Aza | 156/619.1 |
| 4,973,377 | 11/1990 | Katsuoka et al. | 156/601 |
| 5,223,078 | 6/1993 | Maeda et al. | 156/601 |
| 5,288,363 | 2/1994 | Araki | 156/601 |
| 5,408,952 | 4/1995 | Wakabayashi et al. | 117/201 |
| 5,486,129 | 1/1996 | Sandhu et al. | 451/5 |
| 5,653,799 | 8/1997 | Fuerhoff | 117/14 |
| 5,817,171 | 10/1998 | Sakurada et al. | 117/13 |
| 5,846,318 | 12/1998 | Javidi | 117/14 |
| 5,858,086 | 1/1999 | Hunter | 117/84 |

*Primary Examiner*—Benjamin Utech
*Assistant Examiner*—Kin-Chan Chen
*Attorney, Agent, or Firm*—Senniger, Powers, Leavitt & Roedel

[57] ABSTRACT

An open loop control method for use with an apparatus for growing a silicon single crystal having a zero dislocation state and an improved diameter and growth rate uniformity in accordance with the Czochralski process. According to the invention, a heat and mass transfer model based on the silicon charged to a crucible is determined as a function of one or more reference parameters. The reference parameter values are determined from the growth of a reference silicon single crystal. A power profile is then determined as a function of the heat and mass transfer model for a given pull rate profile and model diameter profile. The power profile generated is representative of the power supplied to a heater for providing an amount of thermal energy to the crucible for substantially maintaining a thermal equilibrium at the interface between the melt and the crystal. Finally, the crystal growing apparatus is controlled during the growth of at least a portion of the silicon single crystal by adjusting the thermal energy provided to the crucible by the heater in accordance with the power profile.

17 Claims, 8 Drawing Sheets

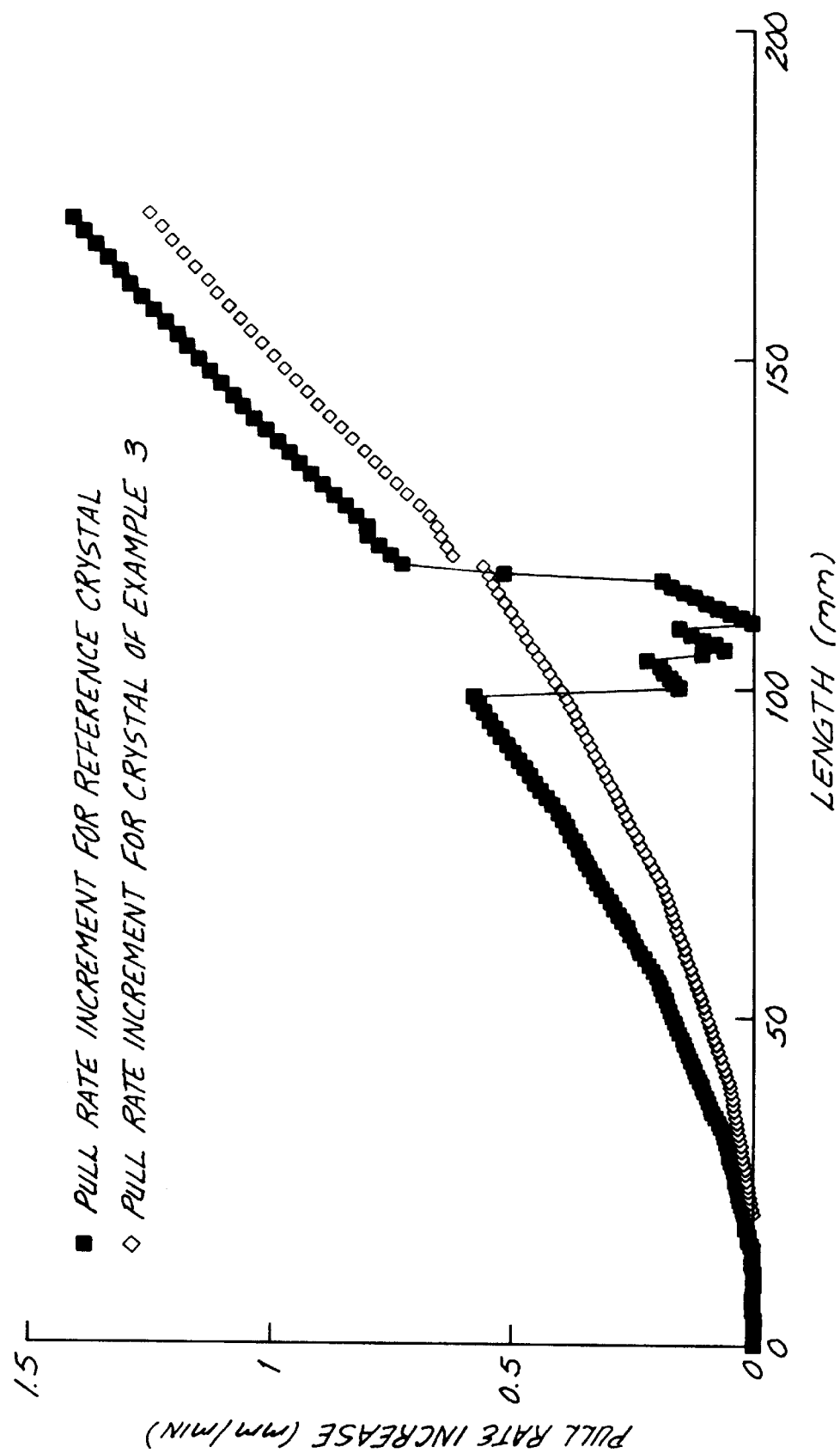

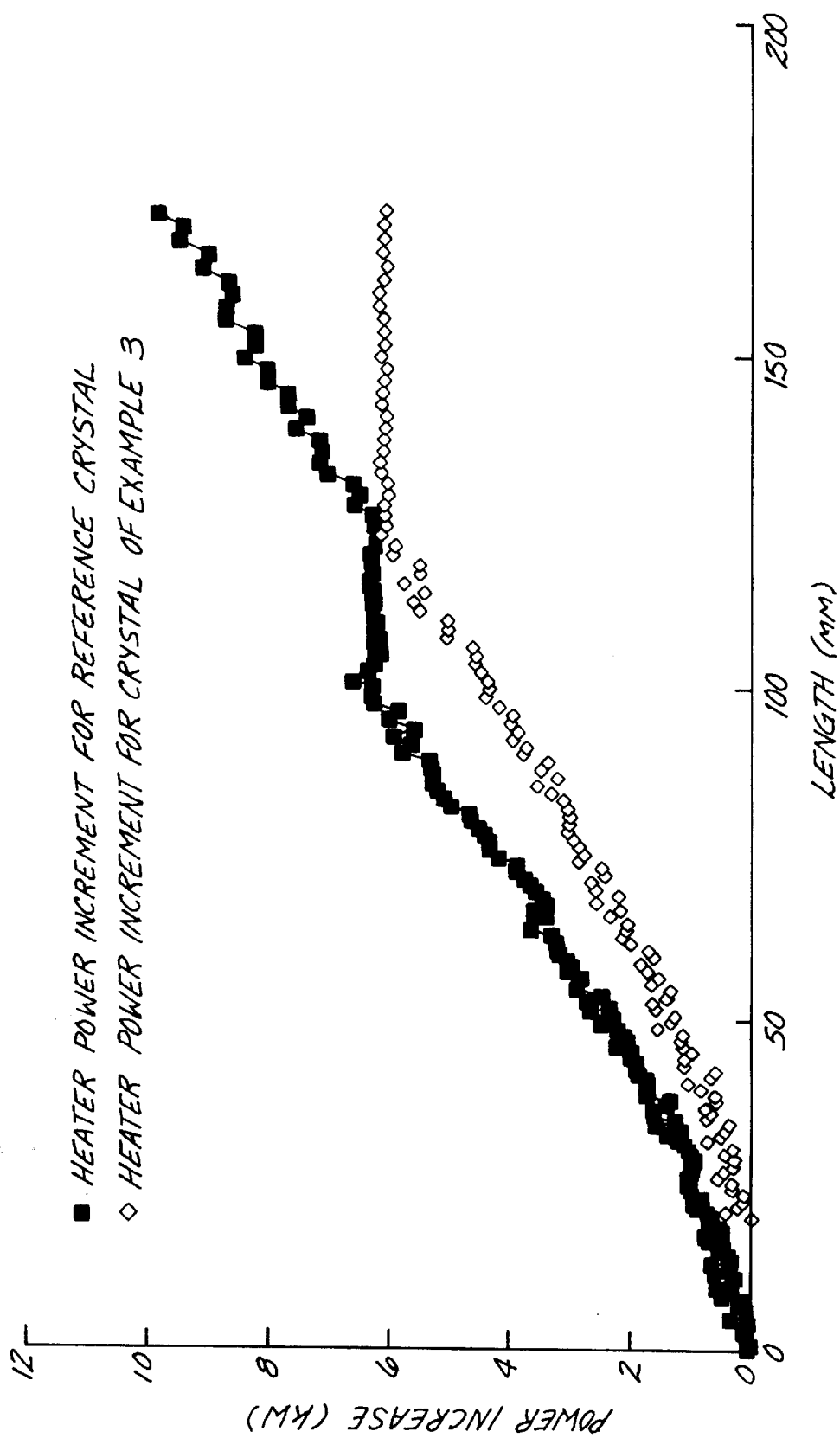

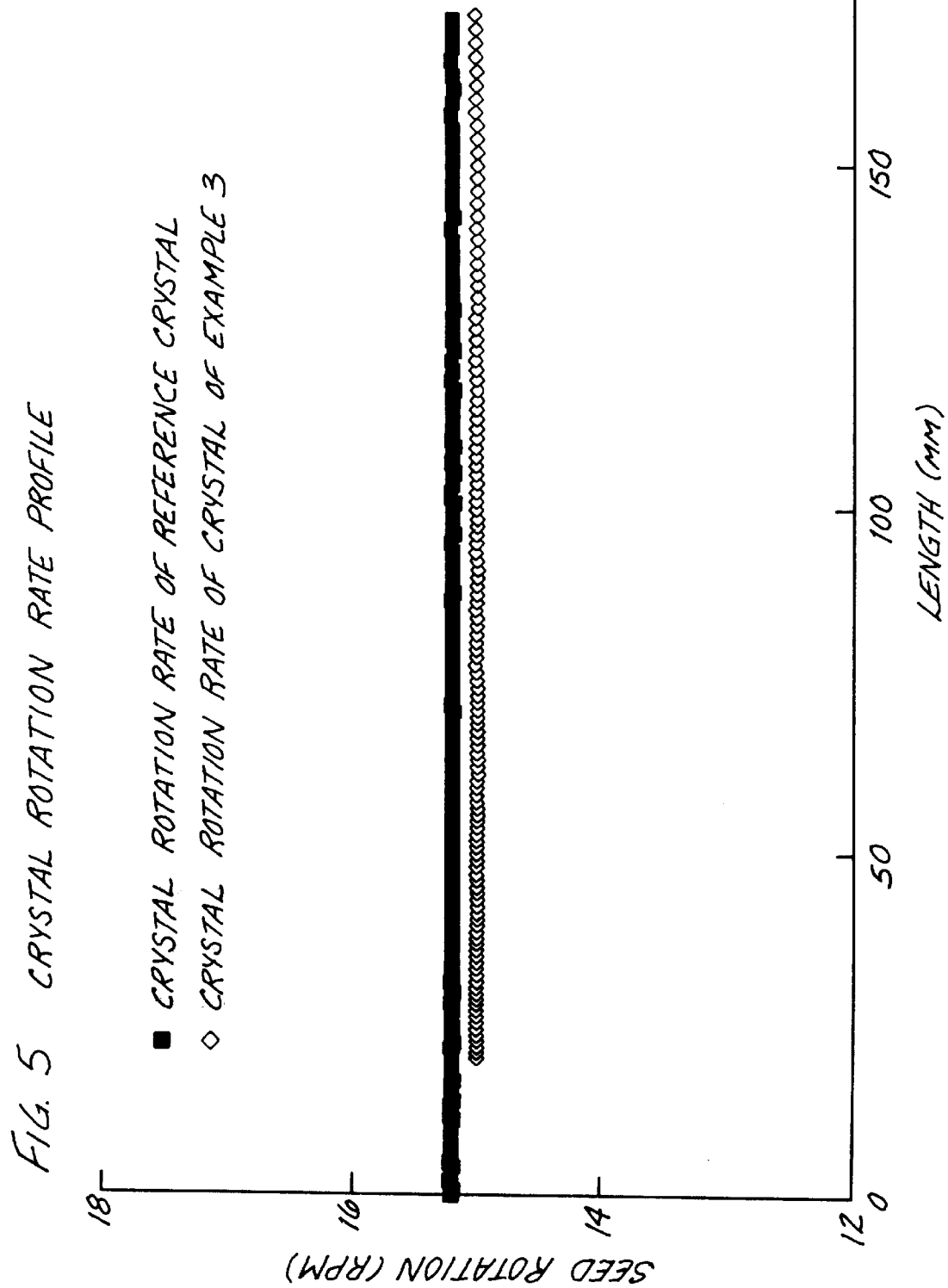

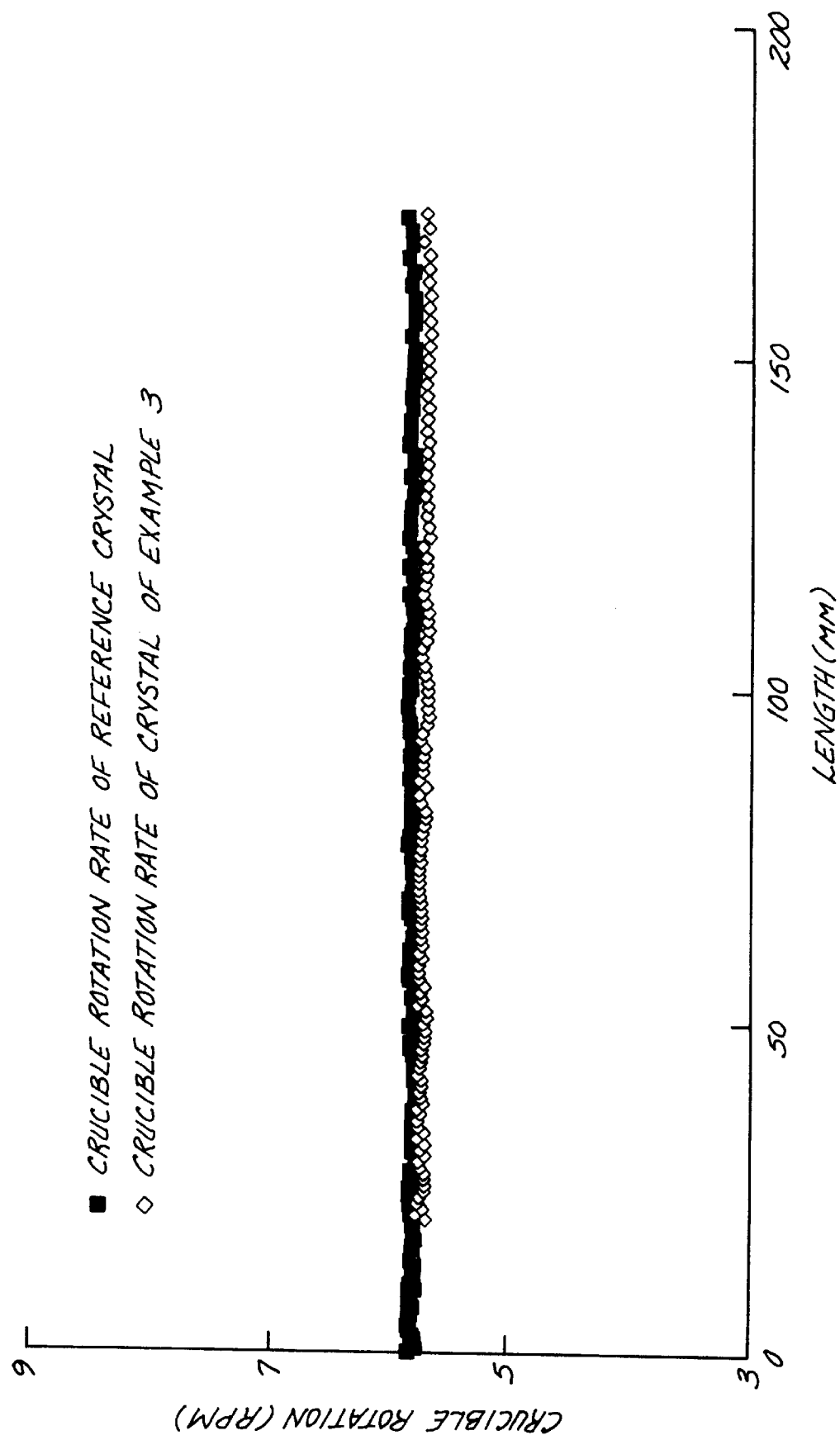

IMAGE OF ENDCONE OF REFERENCE CRYSTAL

IMAGE OF ENDCONE OF CRYSTAL OF EXAMPLE 3

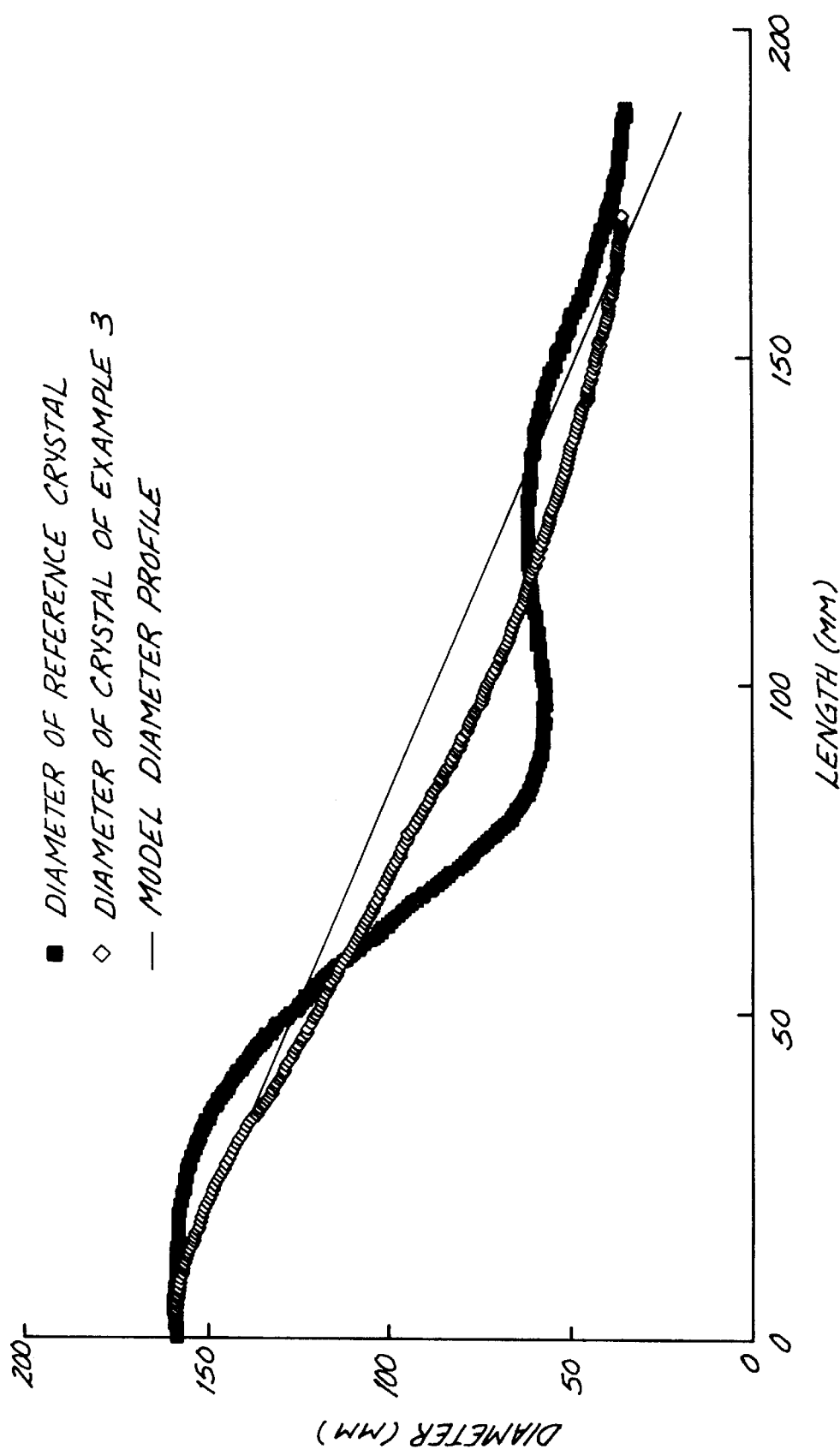
FIG. 8 DIAMETER PROFILES

OPEN-LOOP METHOD AND SYSTEM FOR CONTROLLING GROWTH OF SEMICONDUCTOR CRYSTAL

NOTICE

Copyright© 1997 MEMC Electronic Materials, Inc. A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

The present invention relates generally to an improved method and system for controlling an apparatus or method employing the Czochralski process for growing crystals. More particularly, the present invention relates to an open-loop method and system for automatically controlling the semiconductor single crystal growth process. Even more particularly, the present invention relates to such an open-loop method and system which can be used for automatically controlling the growth of the endcone of a silicon single crystal and maintaining the zero dislocation state of the crystal.

Single crystal silicon, which is the starting material of most processes for the fabrication of semiconductor electronic components, is commonly prepared by the Czochralski process. In this process, polycrystalline silicon is charged to a crucible and melted, a seed crystal is brought into contact with the molten silicon and a single crystal is grown by slow extraction. After formation of a neck is complete, the diameter of the crystal is enlarged by decreasing the pulling rate and/or the melt temperature until the desired or target diameter is reached to form a taper, or crown, portion of the crystal. The cylindrical main body of the crystal which has an approximately constant diameter is then grown by controlling the pull rate and the melt temperature while compensating for the decreasing melt level. Near the end of the growth process but before the crucible is emptied of molten silicon, the crystal diameter must be reduced gradually to form an endcone. When the diameter becomes small enough, the crystal is then separated from the melt.

The process by which the crystal is separated from the silicon melt can adversely affect the quality of the crystal under certain conditions. If the diameter of the crystal is not reduced sufficiently when separation from the melt occurs or if the diameter is reduced too rapidly or irregularly, the crystal will experience thermal shock. Such thermal shock can cause slip dislocations in the endcone which can propagate into the main body of the crystal.

Further, because the endcone of the crystal is typically discarded, it also is desirable to minimize the axial length of the endcone grown on the crystal. The endcone length, however, still must be sufficient to minimize thermal shock to the crystal when separation from the silicon melt occurs. The endcone growth process, therefore, must be carefully controlled to satisfy the often opposing goals of minimizing endcone waste, avoiding the creation of dislocations in the crystal upon separation from the melt, and maintaining an acceptable thermal history for the crystal.

The processes conventionally used to control the crystal growth process depend upon precise control of the process by a skilled crystal puller operator or sophisticated closed-loop control schemes, or both. For example, Maeda et al., U.S. Pat. No. 5,223,078, which is incorporated herein by reference, describes a closed-loop method for controlling the growth of the conical portion of the crystal adjacent the seed crystal (the taper) and requires the active measurement and adjustment of process variables during growth of the taper. In the Maeda method, the melt temperature and diameter of the taper of the crystal being grown are measured. The change rate of the diameter is calculated and this change rate together with the measured temperature are compared to preset target temperature and change rate values. The target temperature is then redetermined based on existing data from a target temperature data file and a target diameter change rate data file. The amount of electricity supplied to the heater is then controlled, preferably by PID action of a controller, to obtain the corrected target temperature.

Katsuoka et al., U.S. Pat. No. 4,973,377, which is incorporated herein by reference, describes a closed-loop method for controlling the diameter of the taper by controlling the melt temperature and the rotational speed of the crucible.

Watanabe et al., U.S. Pat. No. 4,876,438, which is incorporated herein by reference, describes a device for controlling the diameter of a crystal by controlling the power supplied to the heater and the pull rate. The device operates on a closed-loop feedback process wherein two process variables related to crystal diameter are measured during the growth of the crystal and appropriate control action is taken to maintain the desired diameter.

Araki, U.S. Pat. No. 5,288,363, which is incorporated herein by reference, describes a closed-loop method for controlling taper growth. In the Araki method, the deviation of the crystal diameter from a desired crystal diameter is monitored. The pull rate is adjusted to minimize the deviation. In addition, a correction value for the amount of power supplied to the melt heater is calculated based on fuzzy interference. The heater power then is adjusted in accordance with the correction value.

These approaches, however, are not entirely satisfactory. First, they can require expensive and complex process control equipment and techniques as well as significant maintenance. Second, they often are additionally dependent upon some degree of operator control for precise operation. Third, they often decrease the throughput of the crystals grown according to the process. Fourth, care must be taken where process variables are measured as a part of the closed-loop system to avoid contamination of the crystal or silicon melt by the measuring equipment. Fifth, errors in control can cause incorrect adjustments of the crystal pull rate and power rate which, in turn, can adversely affect the success of the crystal growth.

Accordingly, there is a need for a process for controlling the growth of a silicon single crystal that minimizes and simplifies process control equipment and operation requirements, that minimizes dependency on operator control, that minimizes endcone waste, that improves the uniformity of the thermal history of the crystal, and/or that improves the process yield without compromising on diameter control.

SUMMARY OF THE INVENTION

Among the several objects of this invention, therefore, is the provision of an improved method and system of control and operation that overcome the disadvantageous conditions described above; the provision of such method and system for use with a crystal growing apparatus operating in accordance with the Czochralski process; the provision of such method and system for automatically controlling the growth of at least a portion of a silicon single crystal in an open-loop operation; the provision of such method and system that control thermal energy supplied by a heater to a crucible charged with solid silicon in accordance with a power profile based on a suitable heat and mass transfer model for the system; the provision of such method and system that substantially maintain thermal equilibrium at an interface between a melt and a crystal by regulating the heat flux; the provision of such method and system that minimize or eliminate operator involvement in the crystal growth process; the provision of such method and system for controlling the growth and/or shape of an endcone of a crystal; the provision of such method and system that minimize (or substantially eliminate) thermal shock to a crystal when the crystal is separated from a silicon melt; the provision of such method and system for reproducibly growing a portion of a crystal free from dislocations and having a desired diameter profile; the provision of such method and system that maintain a minimum throughput and reduces processing time for crystals grown according to the process; the provision of such method that can be carried out efficiently and economically and such system that is economically feasible and commercially practical; and the provision of such method that is reproducible and produces crystals of comparable quality run after run.

Briefly described, one embodiment of the present invention is an open-loop method for use in combination with an apparatus for growing a silicon single crystal from a silicon melt in accordance with the Czochralski process. The crystal growing apparatus has a crucible containing a charge of silicon. It also has a heater for melting the silicon in the crucible to form a melt from which the single crystal is pulled. The single crystal forms an interface with the melt. According to the method, a heat and mass transfer model based on the silicon initially charged to the crucible is first determined. The model is a function of one or more reference parameters determined from the growth of a reference silicon single crystal. A power profile is then generated. This power profile is representative of an amount of power required by the heater to supply an amount of thermal energy to the crucible sufficient to substantially maintain a thermal equilibrium at the interface between the melt and the crystal. The power profile is a function of the heat and mass transfer model. Finally, the crystal growing apparatus is controlled during the growth of at least a portion of the silicon single crystal by adjusting the power supplied to the heater in accordance with the power profile.

Another form of the present invention is a system for use in combination with an apparatus for growing a silicon single crystal from a silicon melt in accordance with the Czochralski process. The system includes an apparatus for growing a silicon single crystal according to a Czochralski method comprising a crucible containing a charge of silicon, a heater for providing sufficient thermal energy to the crucible to form a melt, a crystal pulling mechanism for pulling the crystal from the melt in the crucible, and a control circuit for determining a power profile and controlling the heater in accordance with the power profile. The power profile is representative of an amount of power required by the heater to supply an amount of thermal energy to the crucible sufficient to substantially maintain a thermal equilibrium at an interface between the melt and the crystal. The power profile is a function of a heat and mass transfer model. The heat and mass transfer model itself is a function of one or more reference parameters determined from the growth of a reference silicon single crystal. The heater is responsive to the control circuit and provides thermal energy to the melt in accordance with the power profile.

Other objects and features will be in part apparent and in part pointed out hereinafter. The method and system can be used to grow single crystals from silicon and other semiconductors specifically and from other materials generally. For simplification of explanation, however, the present invention is explained in the context of silicon single crystal.

BRIEF DESCRIPTION OF THE DRAWINGS

FIG. 3 is a graph showing the pull rate incremental profile for (i) the growth of the endcone of the reference crystal of Example 1, and (ii) the growth of the endcone of the crystal of Example 3.

FIG. 4 is a graph showing the heater power incremental profile for (i) the growth of the endcone of the reference crystal of Example 1, and (ii) the growth of the endcone of the crystal of Example 3.

FIG. 5 is a graph showing the crystal rotation rate profile for (i) the growth of the endcone of the reference crystal of Example 1, and (ii) the growth of the endcone of the crystal of Example 3.

FIG. 6 is a graph showing the crucible rotation rate profile for (i) the growth of the endcone of the reference crystal of Example 1, and (ii) the growth of the endcone of the crystal of Example 3.

FIG. 7(*b*) is an image of the endcone grown on the crystal of Example 3.

FIG. 8 is a graph showing the diameter profiles determined from the images of FIGS. 7(*a*) and 7(*b*) for (i) the endcone grown on the reference crystal of Example 1, and (ii) the endcone grown on the crystal of Example 3. FIG. 8 also shows the model diameter profile determined based on the power profile calculated in Example 2.

Corresponding reference characters indicate corresponding parts throughout the several views of the drawings.

DESCRIPTION OF THE PREFERRED EMBODIMENTS

Figure 1:
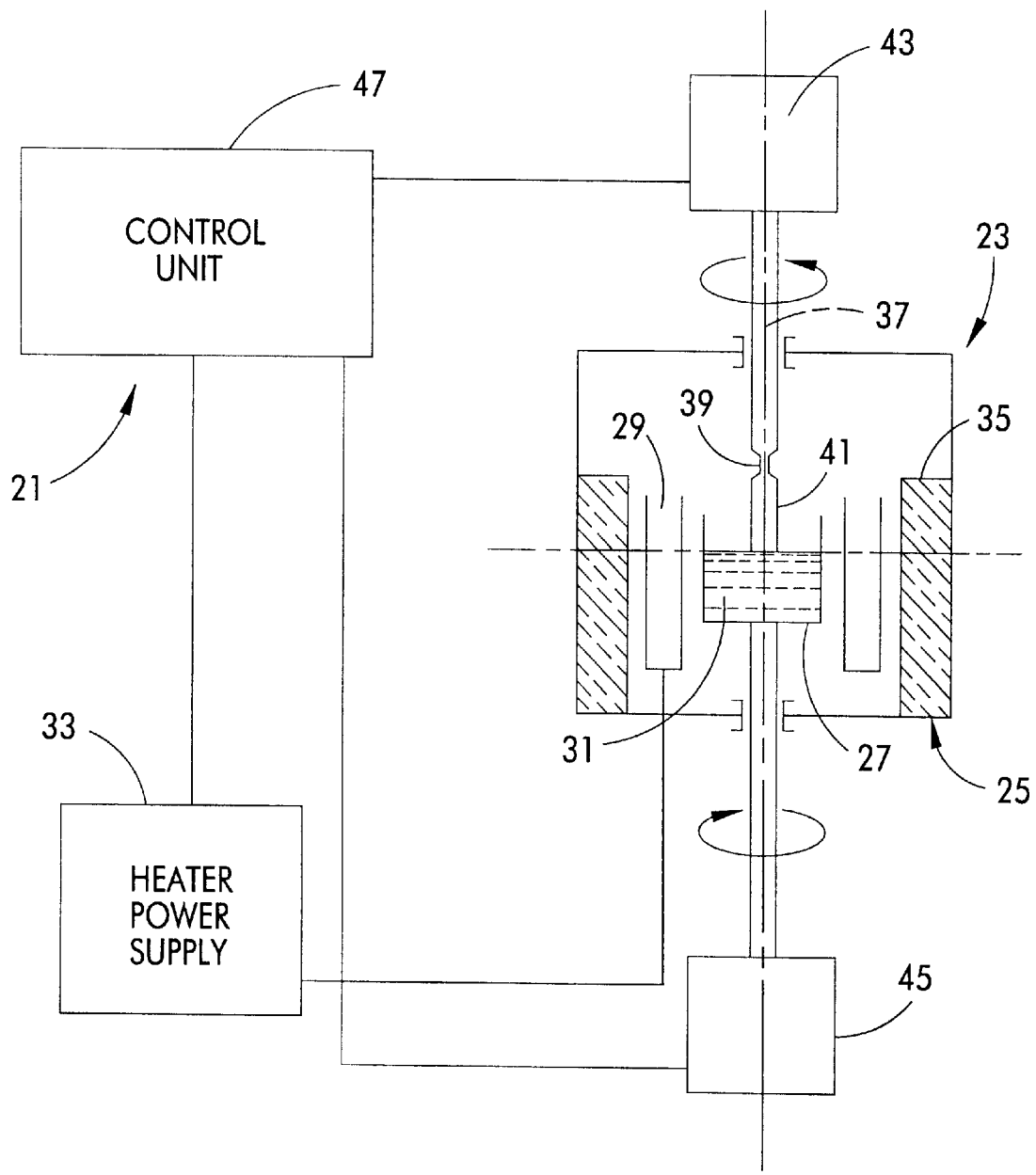
FIG. 1 is an illustration of a crystal growing apparatus and a system for controlling the crystal growing apparatus according to a preferred embodiment of the invention.

Referring now to FIG. 1, a system 21 is illustrated for use with a crystal growing apparatus 23 for producing silicon single crystals by the Czochralski method in accordance with the present invention. In the illustrated embodiment, the crystal growing apparatus 23 includes a vacuum chamber 25 enclosing a fused silica crucible 27 which is surrounded by a resistance heater 29 or other heating means. The crucible 27 holds a polycrystalline silicon melt 31. The melt 31 is provided by adding solid polycrystalline silicon (not shown) to crucible 27. A heater power supply 33 provides electric current through the resistance heater 29 to melt the solid silicon and form melt 31. Resistance heater 29 is generally surrounded by insulation 35 to retain the heat within crucible 27. In one embodiment, a chamber cooling jacket (not shown) fed with cooling water may surround the vacuum chamber 25.

A crystal pulling shaft or wire 37 supporting a monocrystalline silicon seed 39 at its lower end is positioned above melt 31. As the seed 39 is lowered into melt 31, seed 39 begins to melt. After thermal equilibration, the pulling wire 37 is then retracted withdrawing seed 39 from melt 31. As seed 39 is withdrawn, a substantially cylindrical silicon single crystal 41 grows on seed 39, extracting silicon from melt 31. A crystal drive unit 43 continuously retracts pulling wire 37 from melt 31 thus forming the crystal 41 as in a conventional Czochralski process. The crystal drive unit 43 likewise continuously rotates pulling wire 37. After a neck region of the crystal is formed, the pull rate is decreased creating an outwardly flaring region typically referred to as the taper of the crystal. When the desired diameter is obtained, the pull rate and other growth conditions are controlled to provide a substantially continuous diameter for a main body between the taper and the endcone of the crystal.

A crucible drive unit 45 rotates crucible 27 in a direction opposite the direction of rotation of crystal 41 as pulling wire 37 pulls crystal 41 from melt 31. As crystal 41 grows, crucible drive unit 45 likewise raises crucible 27 within vacuum chamber 25 to compensate for depletion of melt 31. As melt 31 approaches depletion, the crystal diameter is gradually decreased resulting in the formation of a conical endcone of crystal 41. Once the diameter of the endcone is sufficiently small, generally 2 mm to 4 mm, detachment of crystal 41 from melt 31 can be accomplished without causing dislocations to spread to the main body of crystal 41. Crystal 41 is then removed from vacuum chamber 25 and may be processed to form silicon wafers.

In one embodiment, crystal drive unit 43 rotates crystal 41 according to a predetermined crystal rotation rate profile as it pulls crystal 41 from melt 31 according to a predetermined pull rate profile. Crucible drive unit 45 likewise rotates crucible 27 according to a predetermined crucible rotation rate profile usually in a direction opposite to the direction of rotation of crystal 41. A control unit 47, generally including a programmed digital or analog computer, controls, among other things, the heater power supply 33, crucible drive unit 45 and crystal drive unit 43. For example, the control unit 47 may control the power supplied to resistance heater 29 by heater power supply 33 in accordance with a predetermined power profile. As described below, a heat and mass transfer model may be employed to derive the power profile as a function of reference parameters determined from the growth of a reference crystal for a specified pull rate profile and model diameter profile. The power profile is representative of the power supplied to heater 29 which is necessary to provide an amount of thermal energy to the crucible for substantially maintaining a thermal equilibrium at the interface between melt 31 and crystal 41. Control unit 47 likewise controls crystal drive unit 43 and crucible drive unit 45 and, thus, the crystal and crucible rotation rates and the crystal pull rate. According to the invention, control unit 47 automatically controls the operation of crystal growing apparatus 23 on an open-loop basis for the growth of at least a portion of crystal 41.

Accurate and reliable control is desired during the crystal growth process, including during growth of the second half of the main body of crystal 41 and during growth of its endcone. The main body preferably is grown with a substantially constant diameter while the endcone is preferably grown with a substantially constant slope and a substantially conical shape. These goals are achieved when control unit 47 operates crystal growing apparatus 23 in accordance with the power profile for a given pull rate profile and model diameter profile during the growth of at least a portion of crystal 41. The method and apparatus of the present invention can be effectively used to control the growth of at least the second half of the body of crystal 41 through the growth of its endcone from melt 31, or of any discrete portion of crystal 41 within the corresponding axial boundaries. Preferably, the method and apparatus are used to control the growth of an endcone of crystal 41.

The pull rate profile and model diameter profile are target profiles specified for the crystal growth process employing the power rate profile. The pull rate profile and model diameter profile can be, independently, constant or can vary during the growth of the crystal. In addition, the crystal and crucible rotation rates employed during growth of crystal 41 may be, independently, substantially constant or gradually ramped downward as the desired portion of the crystal is grown.

In a preferred embodiment of the invention, the heat and mass transfer model used to derive the power profile is one that is effective for analyzing conditions at the interface between the melt 31 and crystal 41 and for determining or characterizing thermal equilibrium at that interface. The representative model allows the development of a profile of the power required by heater 29 to supply an amount of thermal energy to crucible 29 which is sufficient to maintain thermal equilibrium at the interface for a given crystal puller, pull rate profile and model diameter profile as a function of a given set of reference parameters. These reference parameters are calculated for the heat and mass transfer model based on process variable data (for example, pull rate, power rate, crystal diameter, crystal rotation rate and crucible rotation rate) obtained from the growth of a reference single silicon crystal.

The heat and mass transfer model of the present embodiment employs an overall mass balance of the silicon contained in the crucible (that is, the silicon initially charged to the crucible) which yields equation 1:

$$M_R = M_I - M_C - (\pi/4)\rho \int_{t0}^{t} v_p \phi^2 dt \qquad (1)$$

wherein $M_R$ is the mass of silicon remaining in the crucible;

$M_I$ is the mass of silicon initially charged to crucible;

$M_C$ is the mass of silicon contained in the crystal neck, taper and body; and $$(\pi/4)\rho \int_{t0}^{t} v_p \phi^2 dt \qquad (2)$$

represents the mass of silicon contained in the endcone, and wherein $\rho$ is the density of silicon;

$v_p$ is the instantaneous pull rate;

$\phi$ is the diameter of the crystal at the interface;

t is the instantaneous time;

t0 is the time at which the growth of the crystal begins; and dt is the time differential.

The model then employs an overall heat balance of the silicon used in the process which yields equation 3:

$$H_I + H_F = H_L \qquad (3)$$

wherein $H_I$ is the heat supplied to the silicon in the crucible and the crystal neck, taper, body and endcone during the growth process. This represents the heat provided to system 21 by heater 29 and, as such, corresponds to the power profile;

$H_F$ is the heat of fusion for the silicon which can be represented by equation 4:

$$H_F = h_f v_p (\pi \phi^2 / 4) \quad (4)$$

wherein $h_f$ is the specific heat of fusion;

$v_p$ is the instantaneous pull rate; and $\phi$ is the diameter of the crystal at the interface; and $H_L$ is the heat loss from the silicon in the crucible and the crystal neck, taper, body and endcone during the growth process.

It has been experimentally discovered that the heat loss for the system, $H_L$, which primarily is heat loss through convection and radiation, can be approximated with substantial accuracy by equation 5:

$$H_L = kM_I = k \left[ M_I - M_C - (\pi/4)\rho \int_{t0}^{t} v_p \phi^2 dt \right] + d \cdot L + e \cdot \phi \quad (5)$$

wherein k is an experimentally obtained constant.

Insertion of equations 4 and 5 into equation 3 yields equation 6:

$$H_I = k \left[ M_I - M_C - (\pi/4)\rho \int_{t0}^{t} v_p \phi^2 dt \right] + d \cdot L + e \cdot \phi - h_f v_p (\pi \phi^2 / 4) \quad (6)$$

Simplification of the resulting equation 6 yields equation 7:

$$H_I = a + \left[ b \cdot \int_{t0}^{t} v_p \phi^2 dt \right] + c \phi^2 v_p + d \cdot L + e \cdot \phi \quad (7)$$

wherein coefficients a, b, c, d and e are experimentally obtained reference parameters;

L is the instantaneous length of the crystal; and $\phi$ is the instantaneous diameter of the crystal.

According to this embodiment of the invention, the programmed digital or analog computer of control unit 47 controls, among other things, crystal drive unit 43 and heater power supply 33 as a function of the heat and mass transfer model. Control unit 47 is used to program the crystal growth process automation and provides an operator interface which permits the operator of crystal growing apparatus 23 to input the desired reference parameters, pull rate profile, model diameter profile and other process information for the particular crystal being grown. As an example, the operator inputs the desired reference parameters, pull rate profile and model diameter profile to control unit 47. Control unit 47 then executes programs in response to the reference parameters, pull rate profile and model diameter profile stored in memory. These programs determine a power profile (or heat ramp) representative of the power supplied to resistance heater 29 for substantially maintaining thermal equilibrium at the interface between crystal 41 and melt 31 during the growth of crystal 41. Essentially, control unit 47 performs an algorithm using the heat and mass transfer model as a function of the reference parameters for a given pull rate profile and model diameter profile to determine the power profile for the crystal growth process. A control signal is then output to heater power supply 33 from control unit 47 for controlling the power supplied to heater 29 (and thus the thermal energy supplied to the melt) and substantially maintaining thermal equilibrium at the melt interface, thereby controlling the growth process.

The reference parameters for the heat and transfer model are determined from process variable data (for example, pull rate, power supplied to the heater and diameter) measured during or following the growth of a reference silicon single crystal. For example, the reference parameters can be can be obtained for the model using standard regression analysis techniques based on the measured process variable data collected from the growth of the reference crystal. Although the regression analysis calculations can be done manually, regression analysis software programs such as Microsoft Excel 5.0 Regression Analysis Tool-Pack are preferred. The reference parameters derived using the regression analysis calculations result in a heat and mass transfer model that is more accurate, and thus more effective in modeling the system, during the growth of the second half of the main body of the crystal and its endcone.

The diameter of the reference crystal can be measured following the growth process according to a variety of techniques well known in the industry. For example, a photograph or image of the endcone and at least one physical measurement of the reference crystal endcone diameter provides diameter profile estimates of the reference crystal through image analysis methods. Image analysis software is commercially available (for example, Matlab Image Toolbox software) and can be used to conduct the image analysis. Alternatively, and in particular during cylindrical body growth, the diameter of the reference crystal can be measured by real-time methods during the growth process according to a variety of techniques well known in the industry. The crystal pull rate and heater power during the growth of the reference crystal likewise can be measured according to a variety of conventional techniques. Although the reference parameters can be determined adequately using the pull rate, diameter and heater power data from the growth of a single reference crystal using the same crystal pulling apparatus, these reference parameters can be further refined by using the measured data from the growth of two or more reference crystals in the same crystal puller. The value of the reference parameters determined in this manner, however, typically will vary no more than about 5% from the reference parameters determined using the data from the growth of the initial reference crystal.

The method and apparatus are generally effective for any set of specified process conditions. For example, the process is used for operations wherein during the growth of the endcone the pull rate ranges from about 0.05 mm/minute to about 2.5 mm/minute, the crystal rotation rate ranges from about 5 revolutions/minute to about 25 revolutions/minute, the crucible rotation rate ranges from about 1 revolution/minute to about 15 revolutions/minute, and the power ranges from about 90 kW to about 300 kW. These ranges are typical for the Model No. CZ150 crystal puller manufactured by Ferrofluidics.

Preferably, the pull rate ranges from about 0.2 mm/minute to about 2.5 mm/minute, the crystal rotation rate ranges from about 6 revolutions/minute to about 20 revolutions/minute, the crucible rotation rate ranges from about 6 revolutions/minute to about 15 revolutions/minute, and the power ranges from about 160 kW to about 220 kW. Where the process is used for the growth of a portion of the main body of the crystal, substantially the same pull rates, heater powers, crucible rotation rates and crystal rotation rates are used. The preferred pull rates and power rates may be lower than those used for the growth of the endcone and the preferred crystal rotation rates may be higher than those used for the growth of the endcone.

The process likewise is generally applicable to crystals of any diameter, preferably crystals having a diameter of at least 150 mm and more preferably at least 200 mm. The process is also effective for growing crystals prepared from semiconductor materials other than silicon.

In addition, the growth of the reference crystal preferably is controlled such that the measured pull rate, diameter, heater power, crystal rotation rate and crucible rotation rate profiles vary less than about 15% from the corresponding pull rate, diameter, heater power, crystal rotation rate and crucible rotation rate profiles (whether constant or nonconstant profiles) during the growth of crystal 41 according to the novel process. The variation preferably is less than about 10% and more preferably less than about 5%.

Further, the axial length of the endcone grown on the main body of the crystal preferably does not exceed about 450 mm. Additionally, or alteratively, the weight of the endcone grown on the main body of the crystal preferably is less than about 40%, and more preferably less than about 35%, of the weight of an equivalent axial length of the main body. For example, the weight of an endcone having a 200 mm axial length preferably is less than about 40% of the weight of a 200 mm length of the main body of the same crystal.

Figure 2:
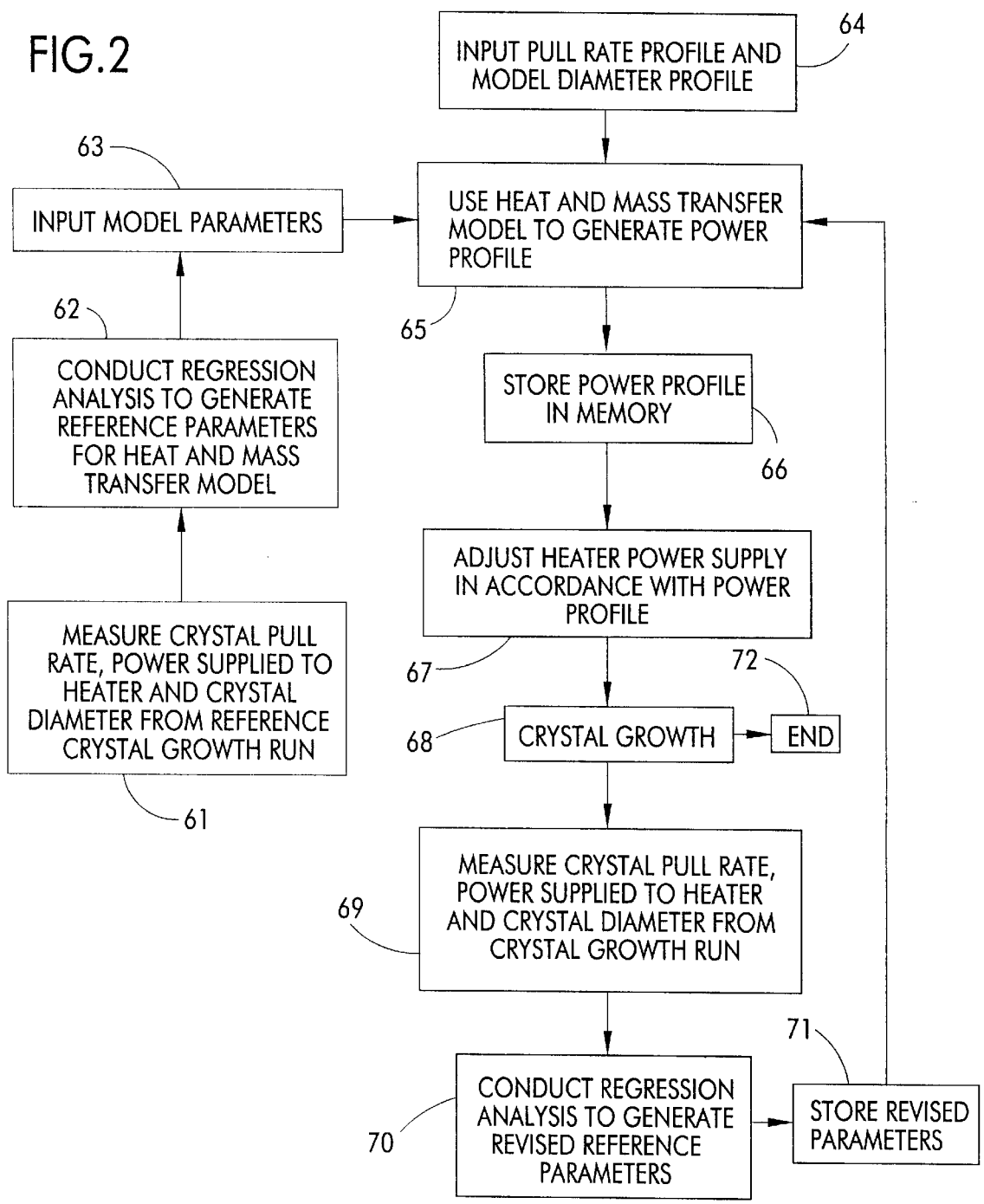
FIG. 2 illustrates a flow diagram of one embodiment of the operation of the crystal growing apparatus of FIG. 1.

Referring now to FIG. 2, the system 21 operates in one embodiment according to a flow diagram for providing open loop control of crystal growing apparatus 23. Beginning at step 61, data on the crystal pull rate, power supplied to heater 29 and crystal diameter are obtained from a reference crystal growth run. At step 62 regression analysis is conducted using the data on the crystal pull rate, power supplied to heater 29 and crystal diameter collected from the reference crystal growth to generate reference parameters for the heat and mass transfer model employed. At step 63 the reference parameters for controlling crystal growing apparatus 23 are stored in a memory. At step 64 the pull rate profile and model diameter profile for the growth of crystal 41 (as well as any other desired process control information such as crystal rotation rate and crucible rotation rate) are stored in a memory. At step 65 control unit 47 executes programs in response to the information stored in memory to determine a power profile representative of the power supplied to resistance heater 29 for substantially maintaining thermal equilibrium at the interface between crystal 41 and melt 31 during the growth of crystal 41. Essentially, the control unit 47 performs an algorithm using the heat and mass transfer model as a function of the reference parameters to determine the power profile for a crystal growth process based on the specified pull rate profile and model diameter profile. At step 66 the power profile is stored in a memory. At step 67 control unit 47 uses this power profile to manipulate the power by adjusting heater power supply 33 and thus the thermal energy supplied to melt 31 by resistance heater 29 in order to achieve the desired thermal equilibrium. At step 68 crystal 41 is grown as control unit 47 manipulates heater power supply 33 to provide power to heater 29 in accordance with the power profile, and manipulates crystal drive unit 43 in accordance with the pull rate profile.

The crystal growth process is complete once step 68 is concluded. Steps 64 through 68 can be followed again to grow additional crystals using the reference parameters previously stored in a memory. Optionally, additional steps 69, 70 and 71 can be conducted to further refine the reference parameters used. At step 69, crystal pull rate, power supplied to heater 29 and crystal diameter data is measured and collected from the crystal growth run of step 68. At step 70 regression analysis is conducted using the data of step 69 and some or all of the corresponding data collected for earlier crystal growth runs to generate revised reference parameters for the heat and mass transfer model. At step 71 the revised reference parameters for controlling crystal growing apparatus 23 are stored in a memory and steps 64 through 68 are repeated using the revised reference parameters.

In operation, system 21 provides an open loop control system for automatically controlling the growth of silicon single crystal using crystal growing apparatus 23. The system advantageously provides silicon single crystal having a zero dislocation state and improved diameter and growth rate uniformity without the need for closed-loop process control schemes or extensive operator involvement. Given a specific pull rate profile and model diameter profile, a heat and mass transfer model can be used to determine the thermal energy necessary to maintain thermal equilibrium at the interface between crystal 41 and melt 31. On the basis of this heat and mass transfer model, control unit 47 can generate a power profile corresponding to the power required by heater 29 to supply an amount of thermal energy to crucible 27 sufficient to maintain thermal equilibrium at the interface. Control unit 47 then controls heater power supply 33 to provide power to resistance heater 29 in accordance with the power profile and, thus, controls the thermal energy supplied to melt 31 to maintain thermal equilibrium at the interface.

In yet another embodiment, the crystal growing apparatus is controlled in accordance with a heat profile. The heat profile is representative of an amount of thermal energy (or heat flux) supplied to crucible 27 which is sufficient to maintain thermal equilibrium at the interface between melt 31 and crystal 41. The heat profile is a function of the heat and mass transfer model used. This heat and mass transfer model can be, for example, the model previously discussed in detail. In addition, the model is a function of one or more reference parameters determined from the growth of a reference silicon single crystal as discussed above. In this embodiment, a heating means is controlled by control unit 47 so as to supply heat to crucible 27 in accordance with a predetermined heat profile during the crystal growth run. Where the heating means is heater 29, the heat profile can employed or converted to a power profile as discussed above. The use of a power profile instead of a heat profile where the heating means is heater 29 is simply a more convenient way of controlling the thermal energy supplied to crucible 27.

The invention disclosed herein is not limited to the heat and mass transfer model specifically disclosed herein. Other heat and mass transfer models can be employed if they provide a suitable approximation of the thermal equilibrium of system 21 or the desired portion of system 21. The process variables measured during the growth of the reference crystal and used in the regression analysis calculations will depend upon the heat and mass transfer model used. These process variables can, but need not, include crystal pull rate, heater power and crystal diameter, as well as crystal rotation rate and crucible rotation rate.

As the Examples given below illustrate, the present invention affords an open-loop process for the growth of the endcone of an crystal. Among other benefits, the process can be used to increase crystal throughput, reduce the demands on control equipment and the crystal puller operator and, for constant pull rates, to improve the uniformity of the thermal history of the crystal.

EXAMPLE 1

Measurement of Process Variables for a Reference Crystal Grown in a Crystal Puller Having a Specific Hot-zone Design A single silicon crystal (158 mm nominal diameter and 1575 mm nominal length) was pulled from a 22 inch diameter crucible containing a 100 kg polysilicon charge using a Ferrofluidics Model No. CZ150 crystal puller. The crystal pull rate during the growth of the crystal body was maintained at between about 0.40 mm/minute to about 1.50 mm/minute. The rates of rotation of the crystal and the crucible were maintained at between about 10 rpm to about 18 rpm, and between about 1 rpm to about 10 rpm, respectively, during the growth of the crystal body. The power supplied to the heater was maintained between about 150 kW to 200 kW during the growth of the crystal body. The pull rate, heater power, crystal rotation rate and crucible rotation rate were continuously measured in the conventional manner and this data collected during the crystal growth process.

Figure 7A:
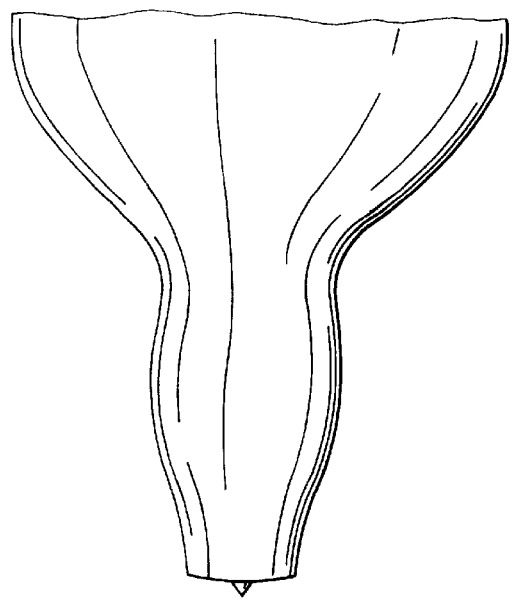
FIG. 7(*a*) is an image of the endcone grown on the reference crystal of Example 1.
Figure 7B:
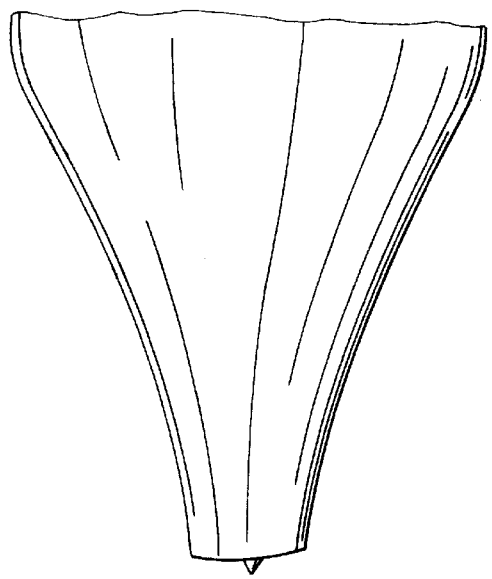

When the length of the ingot reached about 1575 mm, growth of the endcone was commenced. During the growth of the endcone, the crystal pull rate was maintained at between about 0.50 mm/minute to about 2.5 mm/minute; the rates of rotation of the crystal and the crucible were maintained at about 15 rpm and about 5.8 rpm, respectively; and the power supplied to the heater was maintained between about 160 kW to 220 kW. An endcone was successfully grown and separated from the silicon melt when the endcone length reached about 170 mm. The pull rate, power supplied to the heater, crystal rotation rate and crucible rotation rate were continuously monitored during the growth of the crystal. FIGS. 3 through 6 illustrate the crystal pull rate incremental profile, heater power incremental profile, crystal rotation rate profile, and crucible rotation rate profile, respectively, measured during the growth of the endcone. An image of the resulting endcone is shown in FIG. 7(*a*). A diameter profile of the endcone was determined using image analysis of the image of FIG. 7(*a*). This diameter profile is illustrated in FIG. 8.

EXAMPLE 2

Determination of Power Profile for Crystal Puller

Microsoft Excel 5.0 Regression Analysis Tool-Pack was used to solve the equation of the heat and mass transfer model previously set forth in this application, $$H_l = a + \left[ b \cdot \int_{t0}^{t} v_p \phi^2 dt \right] + c\phi^2 v_p + d \cdot L + e \cdot \phi \tag{7}$$

for the values of reference parameters a, b, c, d and e, based on the measured values of pull rate, power supplied to the heater and crystal diameter from the growth of the reference crystal in accordance with the process of Example 1. The values of the reference parameters calculated were as follows:

a=211.1
b=−4.791×10$^{-6}$
c=3.886×10$^{-4}$
d=7.118×10$^{-4}$
e=0.1388

Based on these reference parameters, the pull rate incremental profile of FIG. 3 and the model diameter profile shown in FIG. 8, equation (7) was solved to generate the heater power incremental profile of FIG. 4.

EXAMPLE 3

Growth of Endcone Using the Power Profile Determined for the Crystal Puller

A single silicon crystal (158 mm nominal diameter and 1575 mm nominal length) was pulled from a 22 inch diameter crucible containing a 100 kg polysilicon charge using the Ferrofluidics Model No. CZ150 crystal puller used in Example 1. The crystal pull rate during the growth of the crystal body was maintained between about 0.40 mm/minute and about 1.50 mm/minute during the growth of the crystal body. The rates of rotation of the crystal and the crucible were maintained at between about 10 rpm to about 18 rpm, and between about 1 rpm to about 10 rpm, respectively, during the growth of the crystal body and endcone. The power supplied to the heater was maintained at between about 150 kW and about 200 kW during the growth of the crystal body.

At a crystal length of about 1575 mm, growth of the endcone was commenced. During the growth of the crystal endcone, the power supplied to the heater was controlled in accordance with the heater power profile calculated in Example 2 (with the heater power incremental profile illustrated in FIG. 4), and the pull rate was controlled in accordance with the pull rate incremental profile of illustrated in FIG. 3. An endcone was successfully grown and separated from the silicon melt when the endcone length reached about 170 mm. FIGS. 3 through 6 illustrate the crystal pull rate incremental profile, heater power incremental profile, crystal rotation rate profile, and crucible rotation rate profile, respectively, for the growth of the endcone. An image of the resulting endcone is shown in FIG. 7(*b*). A diameter profile of the endcone was determined using image analysis of the image of FIG. 7(*b*). This diameter profile is illustrated in FIG. 8.

Although specific examples of the present invention and its application are set forth, it is not intended that they be exhaustive or limiting of the invention. These illustrations and explanations are intended to acquaint others skilled in the art with the invention, its principles, and its practical application, so that others skilled in the art may adapt and apply the invention in its numerous forms, as may be best suited to the requirements of a particular use.

In view of the above, it will be seen that the several objects of the invention are achieved and other advantageous results attained.

As various changes could be made in the above constructions and processes without departing from the scope of the invention, it is intended that all matter contained in the above description or shown in the accompanying drawings shall be interpreted as illustrative and not in a limiting sense.

What is claimed is:

1. An open loop control method for use with an apparatus for growing a silicon single crystal, said crystal growing apparatus having a crucible containing a charge of silicon and a heater for melting the silicon in the crucible to form a melt from which the single crystal is pulled, said single crystal forming an interface with the melt, said method comprising the steps of:

determining a heat and mass transfer model to approximate thermal equilibrium at the interface between the melt and the crystal based on the amount of silicon charged to the crucible, said model being a function of one or more reference parameters determined from process variable data obtained from the growth of a reference silicon single crystal;

generating a power profile representative of an amount of power required by the heater to supply an amount of thermal energy to the crucible sufficient to substantially maintain a thermal equilibrium at the interface between the melt and the crystal, said power profile being a function of the heat and mass transfer model relative to time; and controlling the crystal growing apparatus during the growth of at least a portion of the silicon single crystal by adjusting the power supplied to the heater in accordance with the power profile.

2. The method of claim 1 wherein the growth of the portion of the single crystal silicon according to the method is automatically controlled.

3. The method of claim 1 further comprising the step of retrieving the reference parameters from a memory.

4. The method of claim 1 further comprising the steps of:
growing the reference silicon single crystal in accordance with the Czochralski method;
measuring one or more process variables from the growth of the reference silicon single crystal; and
determining the reference parameters as a function of the measured process variables.

5. The method of claim 4 wherein the measured process variables comprise one or more members of the group consisting of crystal pull rate, power supplied to the heater, and crystal diameter.

6. The method of claim 4 wherein a crystal diameter profile for an endcone of the reference silicon single crystal is determined by image analysis.

7. The method of claim 1 wherein the heat and mass transfer model comprises the following formula:

$$H_I = a + \left[ b \cdot \int_{t0}^{t} v_p \phi^2 dt \right] + c\phi^2 v_p + d \cdot L + e \cdot \phi \quad (7)$$

wherein
$H_I$ is the thermal energy supplied to the crucible by the heater;
a, b, c, d and e independently are the reference parameters;
$v_p$ is the instantaneous crystal pull rate;
L is the instantaneous length of the crystal;
$\phi$ is the diameter of the crystal at the interface;
t is the instantaneous time;
t0 is the time at which the growth of the crystal begins; and
dt is the time differential; and
wherein the power profile is a function of $H_I$ relative to time.

8. The method of claim 7 wherein coefficients a, b, c, d and e comprise the reference parameters and are determined through regression analysis based on one or more process variables measured from the growth of a portion of the reference silicon single crystal.

9. The method of claim 8 wherein the process variables comprise one or more members of the group consisting of crystal pull rate, power supplied to the heater, and crystal diameter.

10. The method of claim 7 wherein a crystal diameter profile for at least a portion of the reference silicon single crystal is determined by image analysis.

11. The method of claim 1 wherein the reference silicon single crystal is grown according to a first crystal rotation rate profile and a first crucible rotation rate profile;

the silicon single crystal is grown according to the power profile, a second crystal rotation rate profile and a second crucible rotation rate profile;

the first crystal rotation rate profile varies from the corresponding second crystal rotation rate profile by less than about 15%; and the first crucible rotation rate profile varies from the corresponding second crucible rotation rate profile by less than about 15%.

12. The method of claim 1 comprising controlling the crystal growing apparatus during the growth of at least a portion of the silicon single crystal by adjusting the rate at which the crystal is pulled from the melt in accordance with a pull rate profile.

13. The method of claim 1 wherein the crystal growing apparatus is controlled by adjusting the power supplied to the heater in accordance with the power profile during the growth of an endcone on the main body of the silicon single crystal.

14. The method of claim 13 wherein the endcone grown on the crystal has an axial length less than about 450 mm.

15. The method of claim 13 wherein the weight of the endcone grown on the main body of the crystal is less than about 40% of the weight of an equivalent axial length of the main body.

16. The method of claim 1 wherein the crystal has an average diameter greater than about 200 mm.

17. An open loop control method for use with an apparatus for growing a silicon single crystal, said crystal growing apparatus having a crucible containing a charge of silicon and a heater for melting the silicon in the crucible to form a melt from which the single crystal is pulled, said single crystal forming an interface with the melt, said method comprising the steps of:

determining a heat and mass transfer model to approximate thermal equilibrium at the interface between the melt and the crystal based on the amount of silicon charged to the crucible, said model being a function of one or more reference parameters determined from process variable data obtained from the growth of a reference silicon single crystal;

generating a heat profile representative of an amount of thermal energy supplied to the crucible sufficient to substantially maintain a thermal equilibrium at the interface between the melt and the crystal, said heat profile being a function of the heat and mass transfer model relative to time;

controlling the crystal growing apparatus during the growth of at least a portion of the silicon single crystal by adjusting the heat supplied to the crucible in accordance with the heat profile; and controlling the crystal growing apparatus during the growth of at least a portion of the silicon single crystal by adjusting the rate at which the crystal is pulled from the melt in accordance with a pull rate profile.

* * * * *